US010811575B2

(12) United States Patent
Brodoceanu et al.

(10) Patent No.: US 10,811,575 B2
(45) Date of Patent: Oct. 20, 2020

(54) LASER LIFT-OFF MASKS

(71) Applicant: Facebook Technologies, LLC, Menlo Park, CA (US)

(72) Inventors: Daniel Brodoceanu, Cork (IE); David Massoubre, Cork (IE); James Small, Langbank (GB); Oscar Torrents Abad, Cork (IE); Patrick Joseph Hughes, Cork (IE)

(73) Assignee: FACEBOOK TECHNOLOGIES, LLC, Menlo Park, CA (US)

( * ) Notice: Subject to any disclaimer, the term of this patent is extended or adjusted under 35 U.S.C. 154(b) by 0 days.

(21) Appl. No.: 16/049,783

(22) Filed: Jul. 30, 2018

(65) Prior Publication Data

US 2020/0035880 A1 Jan. 30, 2020

(51) Int. Cl.
*H01L 21/00* (2006.01)
*H01L 33/56* (2010.01)
*H01L 21/56* (2006.01)

(52) U.S. Cl.
CPC ............ *H01L 33/56* (2013.01); *H01L 21/561* (2013.01); *H01L 2933/005* (2013.01)

(58) Field of Classification Search
CPC .. H01L 33/56; H01L 21/561; H01L 2933/005
See application file for complete search history.

(56) References Cited

U.S. PATENT DOCUMENTS

| 2011/0177633 | A1 | 7/2011 | Iwayama et al. | |
| 2016/0276560 | A1* | 9/2016 | Obata | H01L 33/38 |
| 2017/0142874 | A1* | 5/2017 | Pourchet | H01L 21/6836 |
| 2017/0365755 | A1* | 12/2017 | Chu | H01L 33/56 |

FOREIGN PATENT DOCUMENTS

EP 2393128 A1 12/2011

OTHER PUBLICATIONS

PCT/US2019/044218, "International Search Report and Written Opinion", dated Nov. 6, 2019, 10 pages.

* cited by examiner

*Primary Examiner* — Victor A Mandala
*Assistant Examiner* — Colleen E Snow
(74) *Attorney, Agent, or Firm* — Weaver Austin Villeneuve & Sampson LLP

(57) ABSTRACT

Techniques related to laser lift-off masks are disclosed. In some embodiments, masking material is applied to a substrate that is attached to a plurality of semiconductor device sets. More specifically, the masking material is applied to one or more regions of the substrate between the semiconductor device sets. When the semiconductor device sets are embedded in a filling material, the masking material may be situated between the substrate and the filling material. Thus, transmitting light through the substrate toward the semiconductor device sets causes the substrate to become detached from the semiconductor device sets. However, the light is at least partially occluded by the masking material.

20 Claims, 15 Drawing Sheets

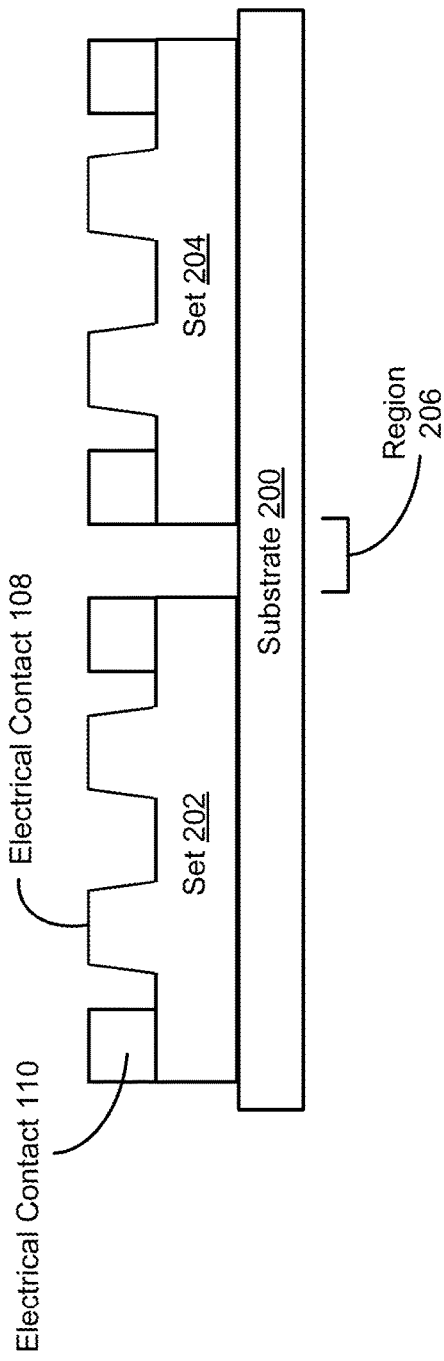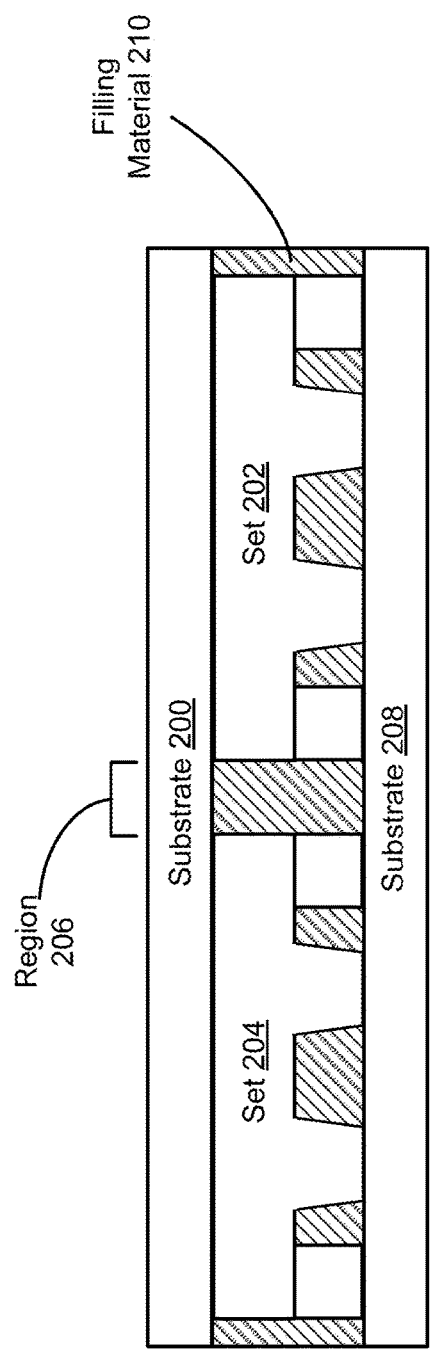

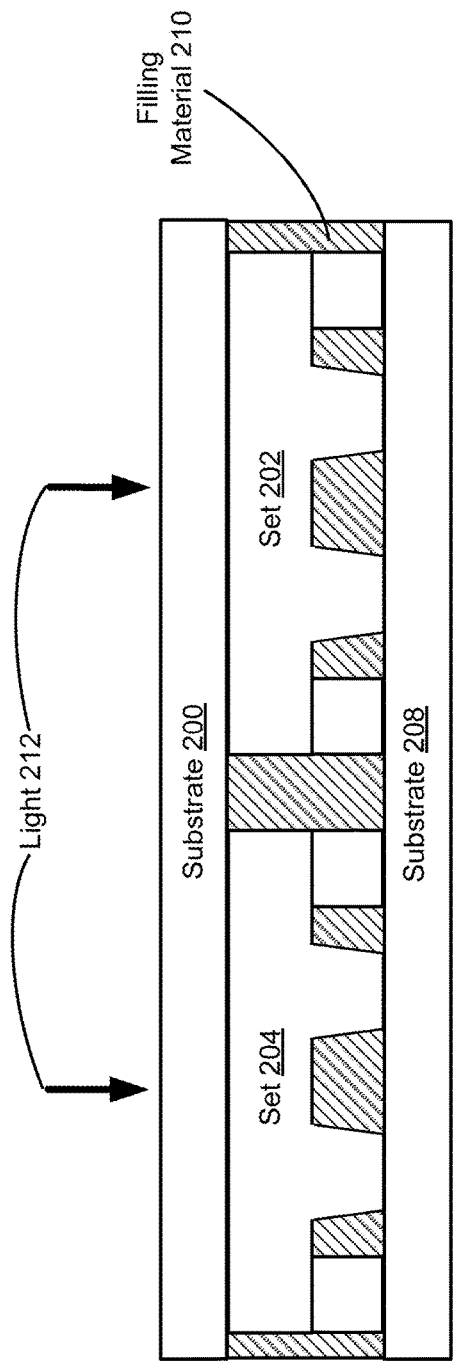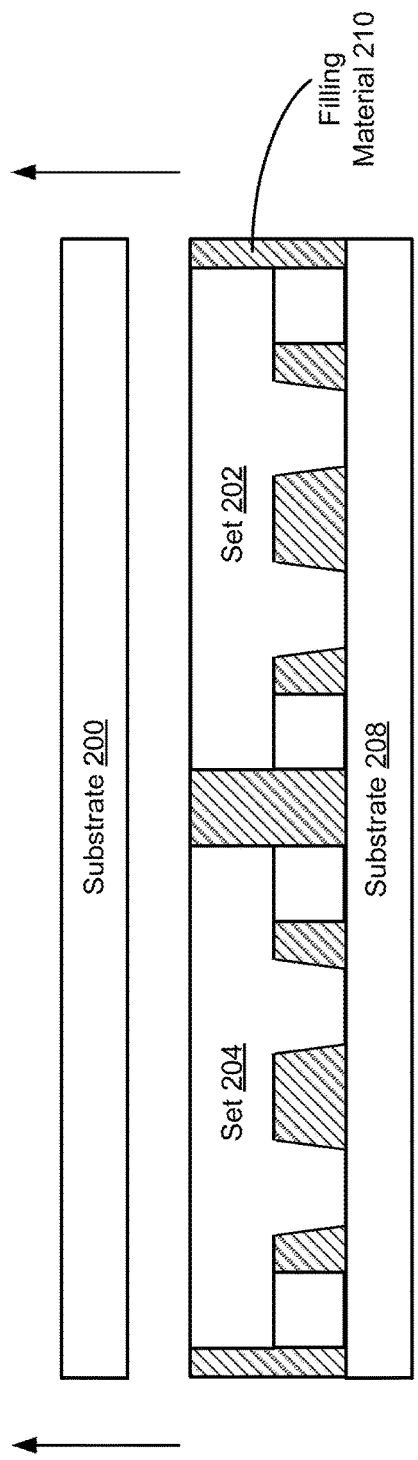

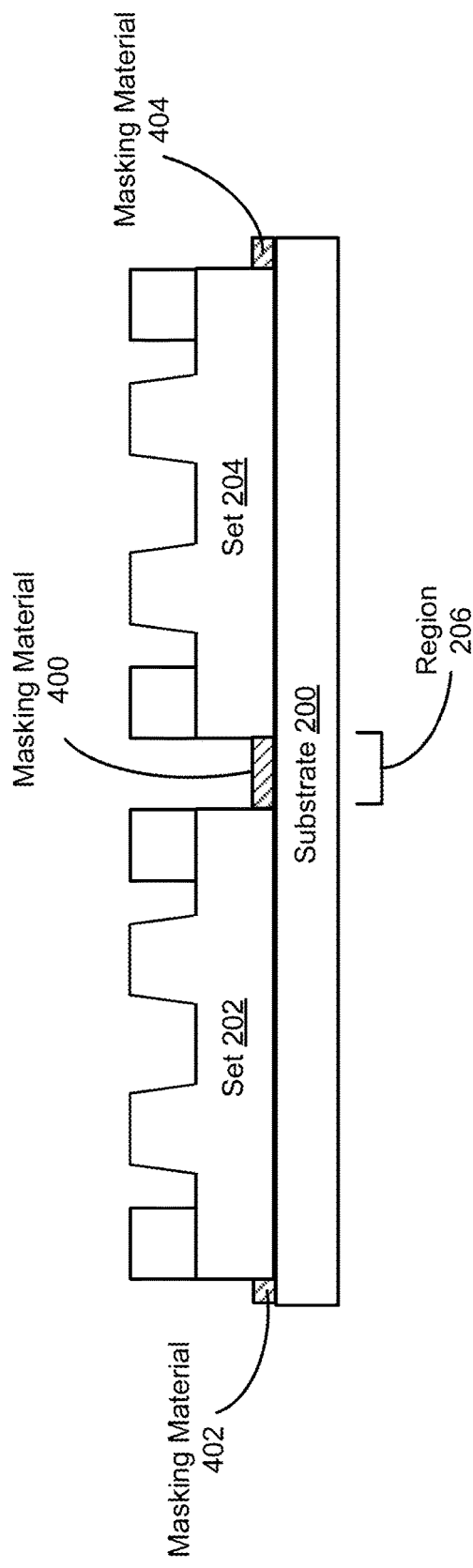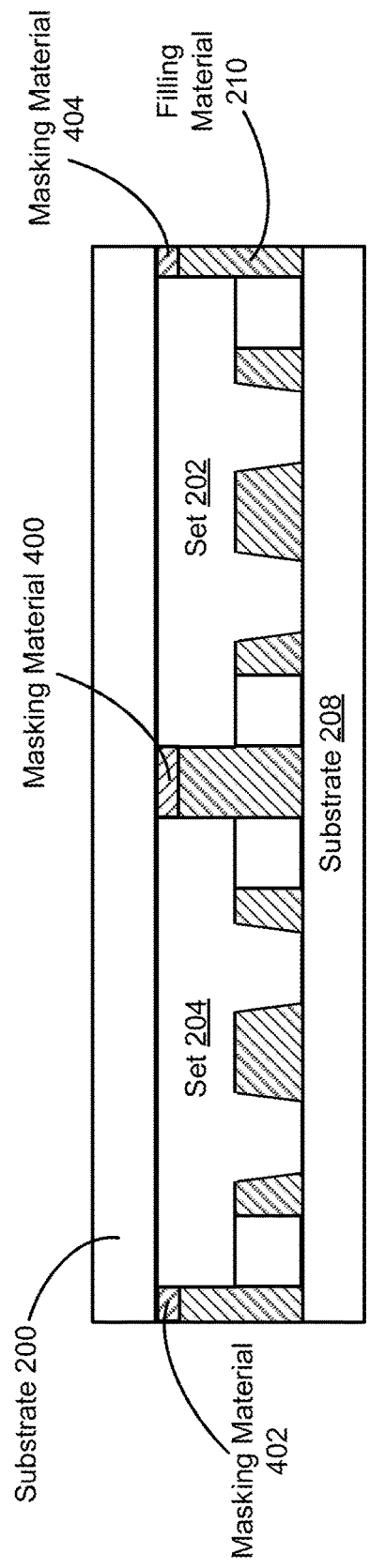

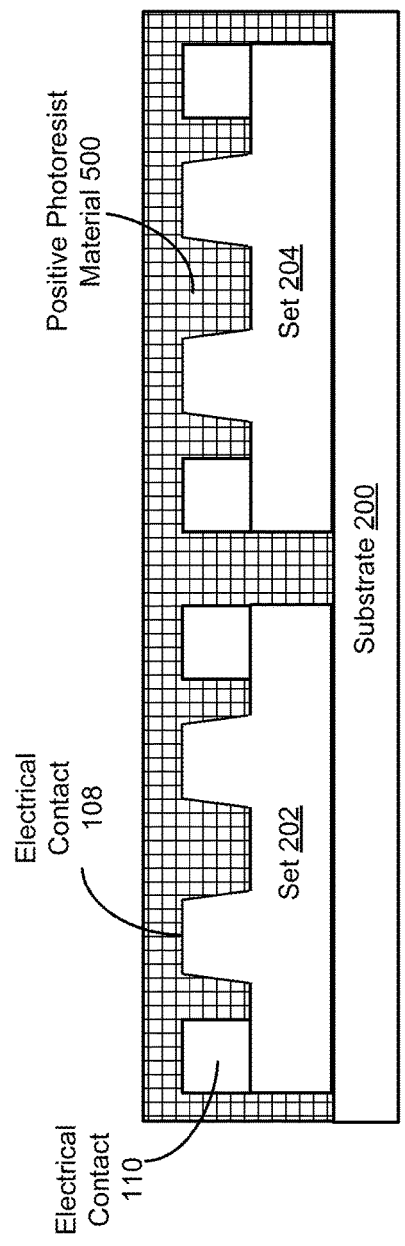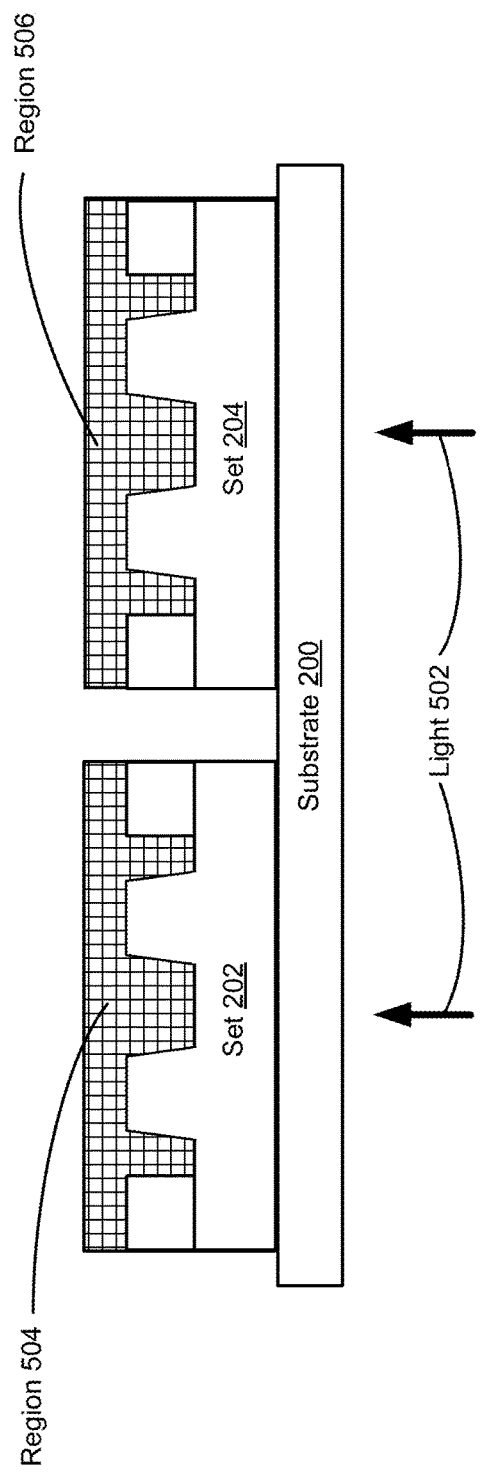

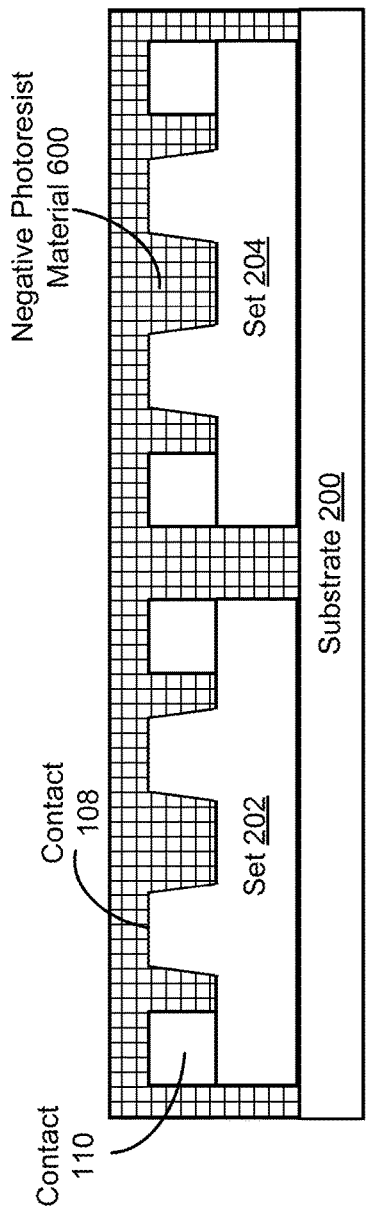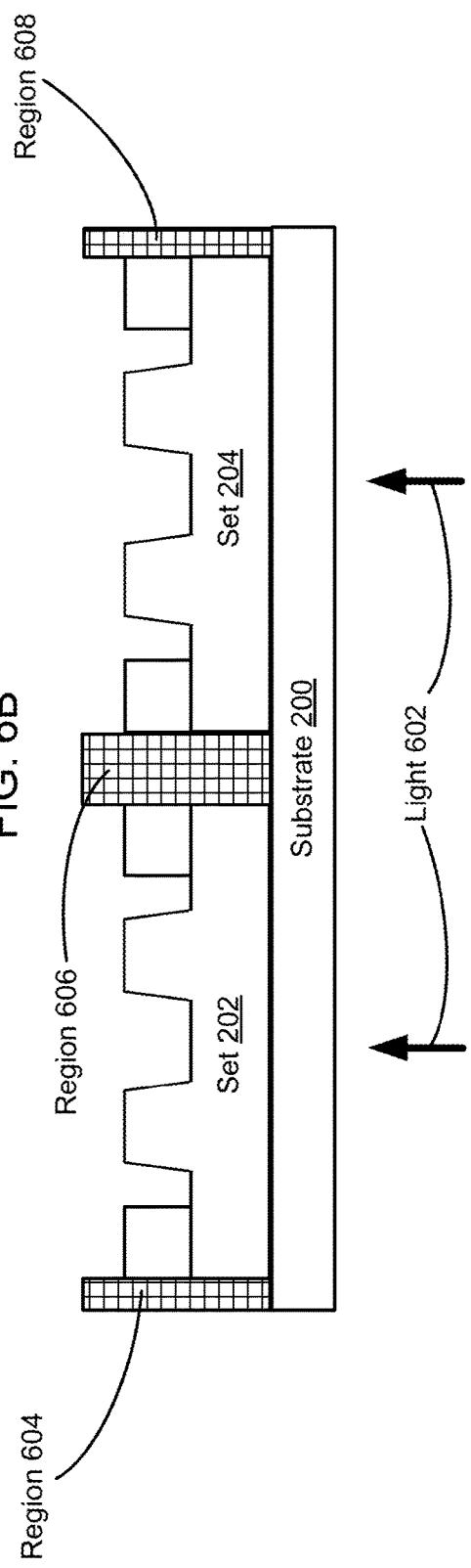

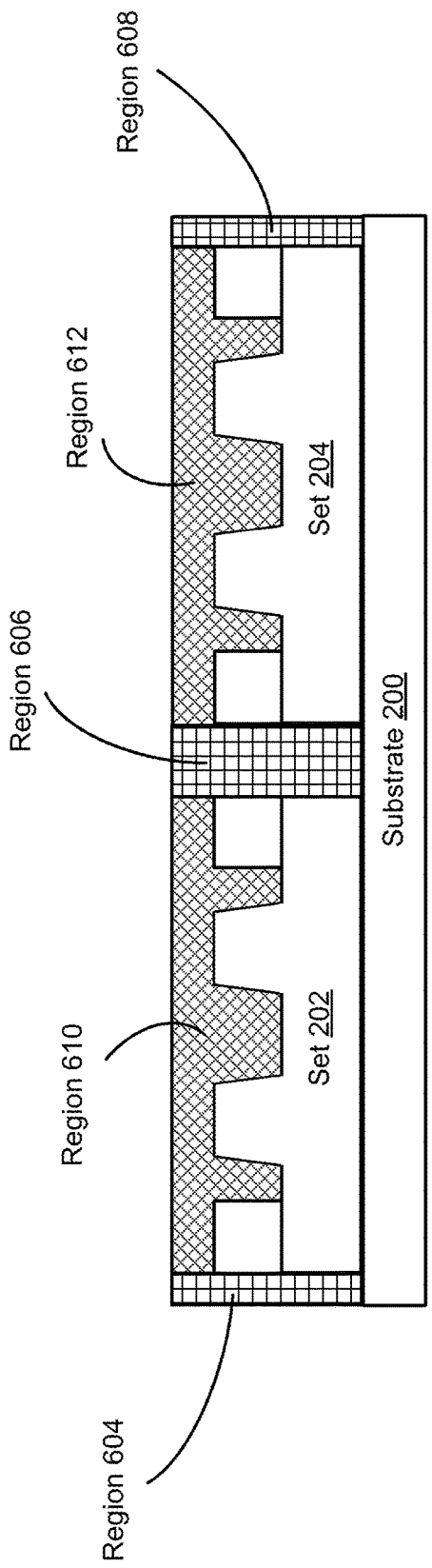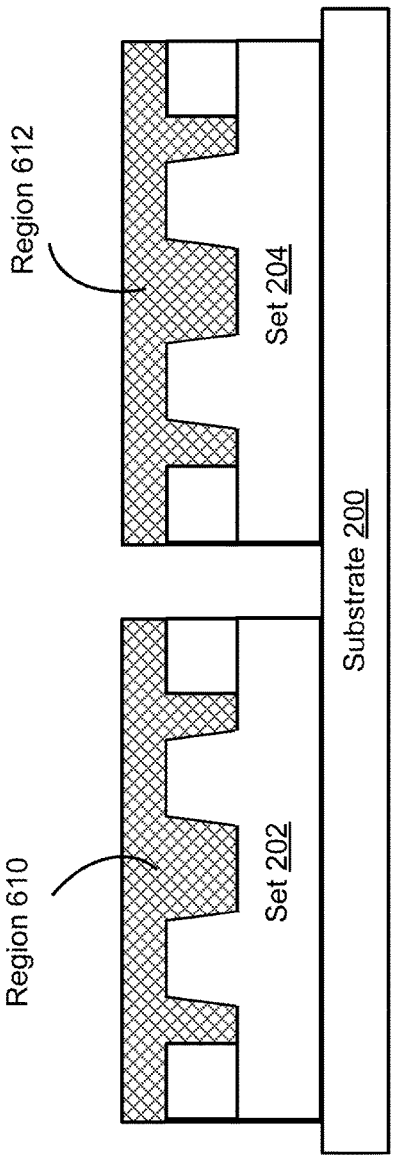

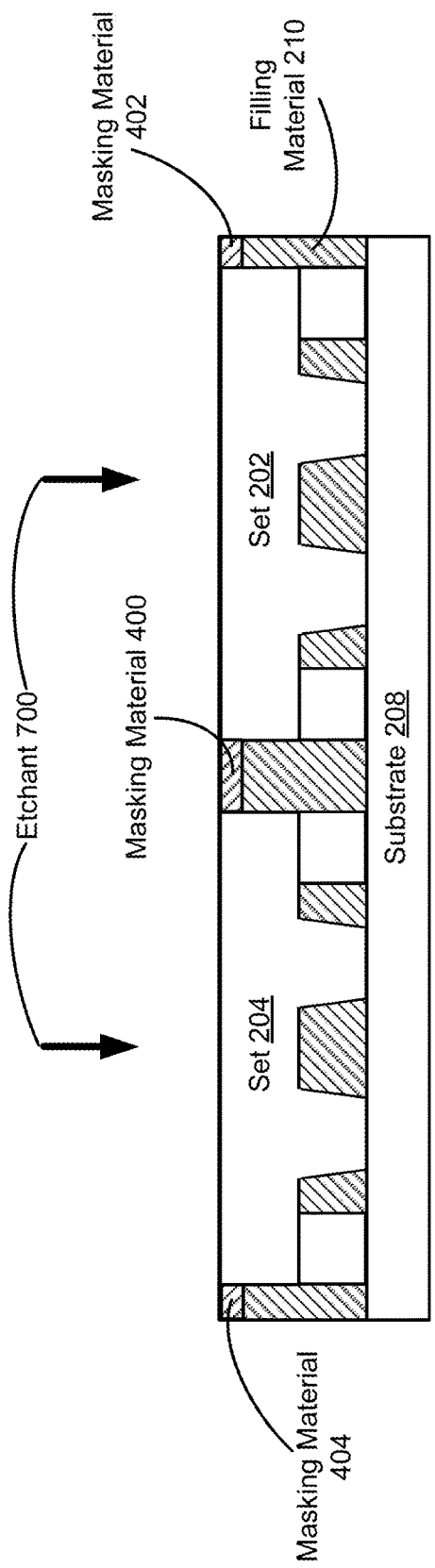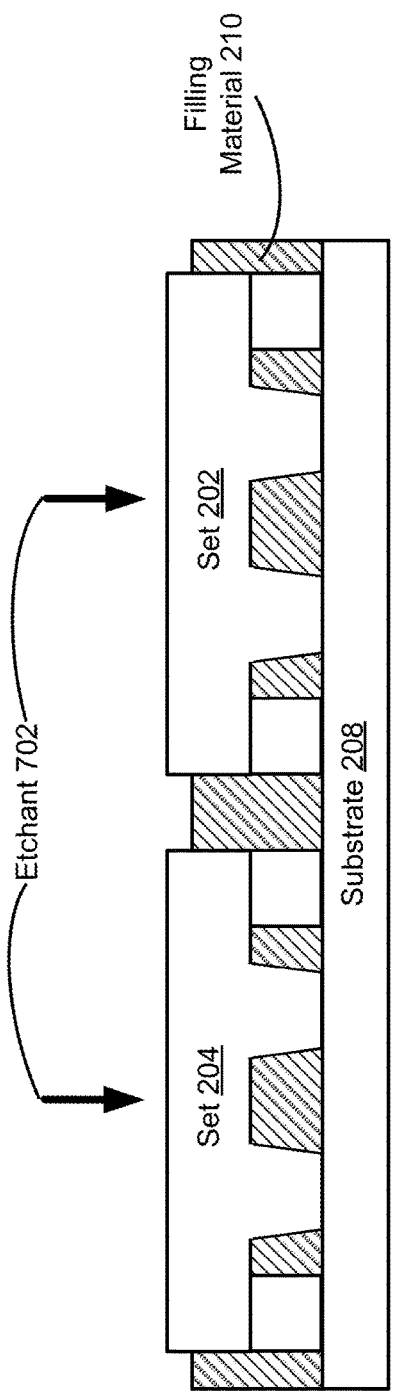

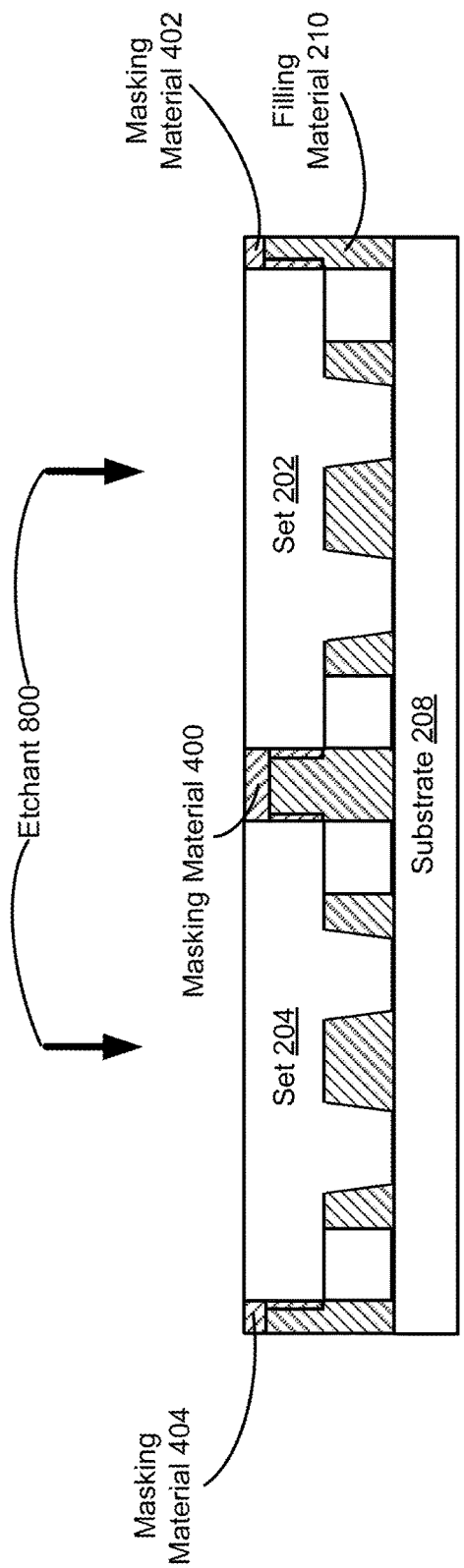
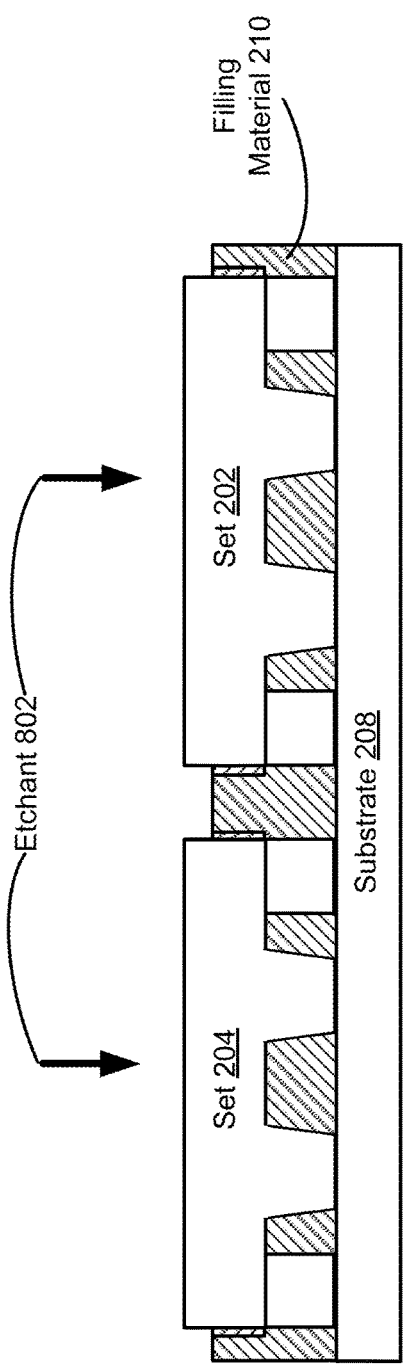

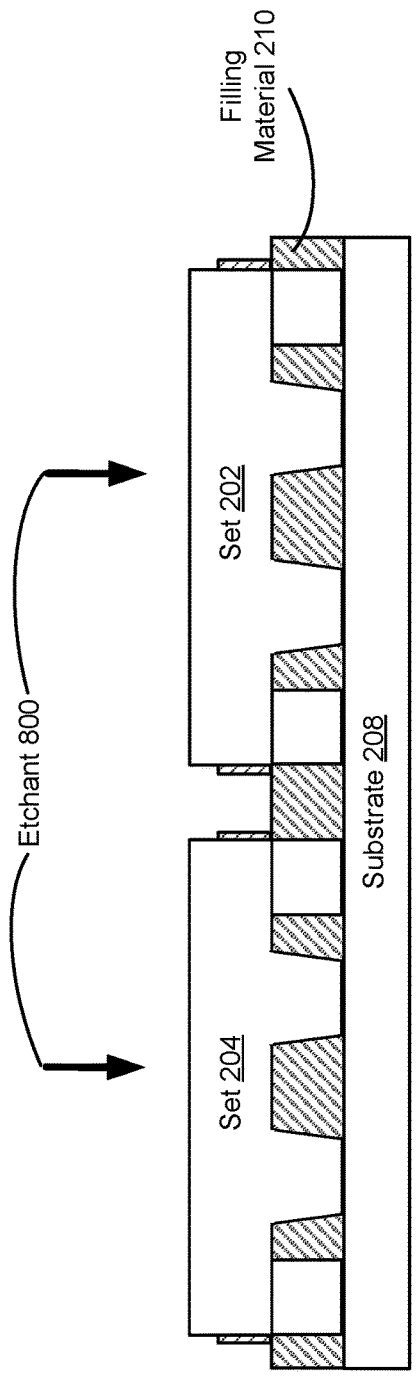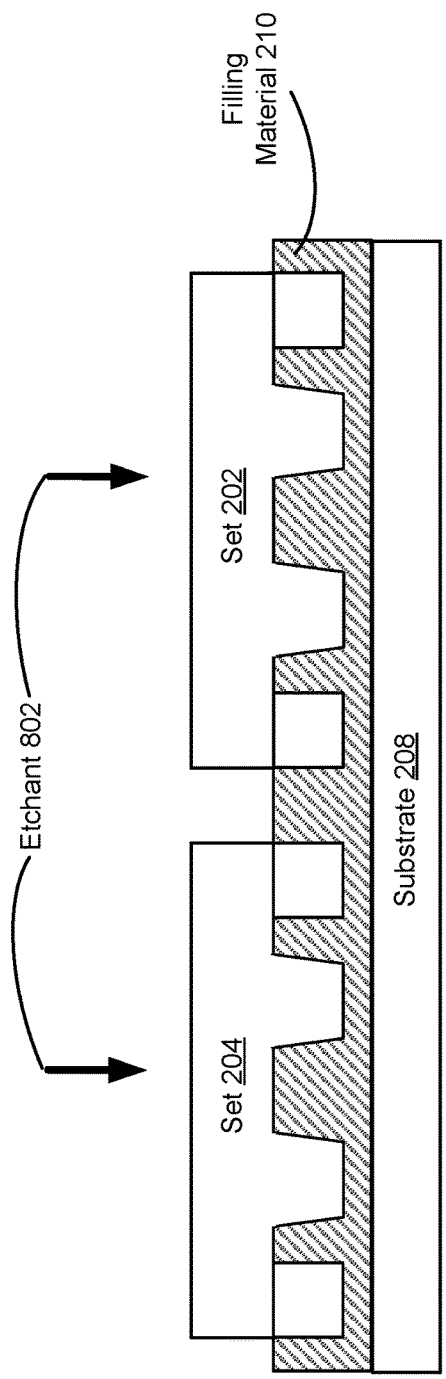

LASER LIFT-OFF MASKS

BACKGROUND

The disclosure relates generally to semiconductor device fabrication, and more specifically to laser lift-off masks.

Semiconductor devices have become prevalent in electronics for providing such benefits as reduced size, improved durability, and increased efficiency. For example, in contrast to an incandescent light bulb, a light-emitting diode (LED) is typically smaller, lasts several times longer, and converts proportionately more energy into light instead of heat. Accordingly, semiconductor devices have even made their way into display systems, such as those found in televisions, computer monitors, laptop computers, tablets, smartphones, and wearable electronic devices. In particular, tiny LEDs can be used to form the sub-pixels of a display system. However, fabricating such tiny LEDs can be challenging.

For example, some display systems incorporate tiny LEDs as flip chips. LED flip chip fabrication often involves a laser lift-off (LLO) technique for separating LEDs from a substrate on which the LEDs were epitaxially grown. If the LEDs are thin, however, they are prone to fracturing when subjected to the LLO technique. Many theories exist as to the proximate cause of the fracturing, but the root cause in each theory is the interaction between laser light and the filling material that embeds the LEDs. As a result of this interaction, many unusable LEDs are fabricated.

SUMMARY

This disclosure relates to semiconductor device fabrication involving LLO masks. The LLO masks can be used to protect filling material from interaction with laser light when LLO is performed. As a result, fracturing of semiconductor devices may be avoided.

In some embodiments, one or more LLO masks are formed on a substrate that is attached to semiconductor device sets. At a minimum, the one or more LLO masks cover one or more gap regions between the semiconductor device sets.

When LLO is performed, laser light is transmitted through the substrate toward the semiconductor device sets and the one or more LLO masks. There is little, if anything, to prevent the laser light from being absorbed by the semiconductor device sets. However, the LLO masks may prevent any significant interaction between the laser light and the filling material. As a result, LLO may be performed to cause the semiconductor device sets to become detached from the substrate without causing the semiconductor device sets to fracture.

BRIEF DESCRIPTION OF THE DRAWINGS

Illustrative embodiments are described with reference to the following figures.

FIGS. 2A-D illustrate an example approach for performing LLO, in accordance with an embodiment.

FIGS. 4A-B illustrate example LLO masks, in accordance with an embodiment.

FIGS. 5A-D illustrate an example approach for forming LLO masks using positive photoresist, in accordance with an embodiment.

FIGS. 6A-F illustrate an example approach for forming LLO masks using negative photoresist, in accordance with an embodiment.

FIGS. 7A-B illustrate an example approach for removing LLO masks, in accordance with an embodiment.

FIGS. 8A-D illustrate an example approach for removing "winged" LLO masks, in accordance with an embodiment.

The figures depict embodiments of the present disclosure for purposes of illustration only. One skilled in the art will readily recognize from the following description that alternative embodiments of the structures and methods illustrated may be employed without departing from the principles, or benefits touted, of this disclosure.

DETAILED DESCRIPTION

In the following description, for the purposes of explanation, specific details are set forth in order to provide a thorough understanding of certain inventive embodiments. However, it will be apparent that various embodiments may be practiced without these specific details. The figures and description are not intended to be restrictive.

Disclosed herein are techniques related to performing LLO during fabrication of semiconductor devices, such as LEDs and photodiodes. In some embodiments, the fabricated semiconductor devices are tiny inorganic LEDs known as micro LEDs. As used herein, a micro LED may refer to an LED that has an active light-emitting area with a linear dimension that is less than 50 µm, less than 20 µm, or less than 10 µm. For example, the linear dimension may be as small as 2 µm or 4 µm. Their small size enables a display system to have a single pixel comprising three of them: a red micro LED, a green micro LED, and a blue micro LED. Their small size also enables micro LEDs to be lightweight, making them particularly suitable for use in wearable display systems, such as watches and computing glasses. However, their small size makes them particularly susceptible to fracturing when subjected to LLO.

Semiconductor Devices

Figure 1:
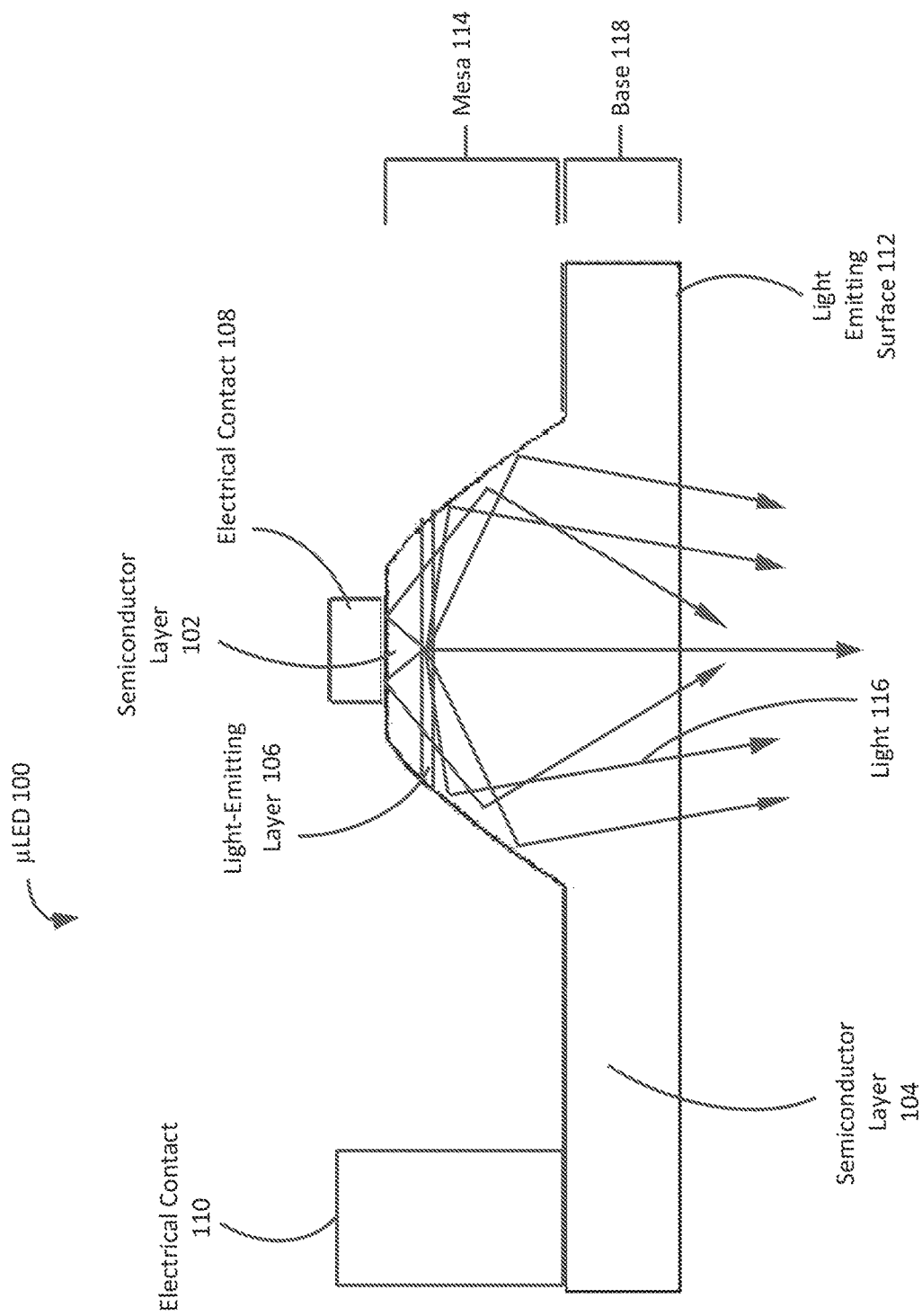
FIG. 1 illustrates an example semiconductor device, in accordance with an embodiment.

Referring to FIG. 1, a cross-sectional view of an example micro LED 100 is provided. The micro LED 100 includes, among other components, a semiconductor structure comprising semiconductor layers 102-104 and a light-emitting layer 106 that is situated between the semiconductor layers 102-104. For example, the micro LED 100 may comprise a semiconductor structure in which the light-emitting layer 106 is a layer of indium gallium nitride that is sandwiched between a layer of p-type gallium nitride and a layer of n-type gallium nitride. In some embodiments, semiconductor layer 102 is a p-type semiconductor, and semiconductor layer 104 is an n-type semiconductor. In some embodiments, semiconductor layer 102 is an n-type semiconductor, and semiconductor layer 104 is a p-type semiconductor.

The semiconductor layers 102-104 are typically very thin. For example, the semiconductor layer 104 may have a thickness of only one or two microns, and the semiconductor layer 102 may be even thinner than that. This makes micro LEDs particularly vulnerable to even the smallest amount of mechanical stress, which can cause cracks to form in one or more semiconductor layers.

The semiconductor layers 102-104 are operatively coupled to electrical contacts 108-110, respectively. The electrical contacts 108-110 are typically made of a conductive material, such as a metallic material. In the example of FIG. 1, the electrical contacts 108-110 are both located on a top surface of the semiconductor structure such that they can both support the micro LED 100 when it is mounted on a substrate. However, in some embodiments, electrical contacts can be located on opposite surfaces of a semiconductor structure.

The light-emitting layer 106 includes one or more quantum wells that output light 116 when a voltage is applied across the electrical contacts 108-110. The light-emitting layer 106 typically has a very small area. For example, its area may be between 1 $\mu m^2$ and 20 $\mu m^2$.

To increase the brightness of light emitted from such a small area, the semiconductor structure may be formed into any of a variety of shapes (e.g., a paraboloid, a cylinder, or a cone) that enable collimation/quasi-collimation of light 116. Such shapes are referred to herein as "mesa" shapes; and collimation and quasi-collimation are collectively referred to herein as "collimation".

In the example of FIG. 1, mesa 114 corresponds to a paraboloid shape that guides light 116 toward through a light-emitting surface 112 of the semiconductor structure. More specifically, the light-emitting layer 106 is approximately positioned at the focal point of the paraboloid such that some of the emitted light is reflected, within a critical angle of total internal reflection, off the inner walls of the paraboloid toward the light-emitting surface 112.

In some embodiments, a mesa shape also has a truncated top that can accommodate an electrical contact. In the example of FIG. 1, mesa 114 corresponds to a paraboloid shape having a truncated vertex that accommodates electrical contact 108. Base 118 refers to the part of the semiconductor structure that is not included in the mesa 114.

The micro LED 100 may include other components, such as a dielectric layer, a reflective layer, and a substrate layer. However, to avoid obscuring the disclosure, such components are not illustrated in FIG. 1.

Laser Lift-Off

FIGS. 2A-D illustrate an example semiconductor fabrication process involving LLO. Although the semiconductor devices illustrated in FIGS. 2A-D are abstractions of LED devices, it should be appreciated that the techniques disclosed herein are equally applicable to any other semiconductor devices.

Referring to FIG. 2A, sets 202-204 of one or more semiconductor devices are attached to a common substrate 200. In the example of FIG. 2A, each set is an array of two unsingulated semiconductor devices. However, it should be appreciated that the techniques described herein are equally applicable to a set comprising any number of semiconductor devices, including a singleton set of one semiconductor device.

The substrate 200 may be composed of a transparent/quasi-transparent material on which sets 202-204 can be epitaxially grown. For example, the substrate 200 may be composed of sapphire on which layers of gallium nitride are grown to produce blue micro LEDs. Example techniques for growing semiconductor structures include, without limitation, Molecular Beam Epitaxy (MBE) or Metalorganic Chemical Vapor Deposition (MOCVD).

In some embodiments, electrical contacts 108-110 are formed thereafter. Thus, one or more semiconductor layers may be situated between the substrate 200 and the electrical contacts 108-110.

Semiconductor devices of the sets 202-204 may be spaced apart by one or more gap regions of the substrate 200. In the example of FIG. 2A, a region 206 separates the rightmost semiconductor device of set 202 from the leftmost semiconductor device of set 204.

Referring to FIG. 2B, the substrate 200 and the attached sets 202-204 are flipped over and placed on a substrate 208 such that the sets 202-204 are situated between the substrates 200 and 208. The substrate 208 may be composed of glass, silicon, or any other inert material. In some embodiments, the substrate 208 is a temporary carrier substrate used to facilitate transportation of the sets 202-204.

At any time relative to situating the sets 202-204 on the substrate 208, the sets 202-204 may be embedded in a filling material 210. The filling material 210 can be any of a variety of polymers including, without limitation, polyvinyl alcohol, polyvinyl acetate, polyester, polymethyl methacrylate, polystyrene, polycarbonate, or polyvinyl butyral. Thus, embedding the sets 202-204 in the filling material 210 may involve immersing the sets 202-204 in a monomer solution that is subsequently polymerized. Among other purposes, the filling material 210 may serve to secure the sets 202-204 to the substrate 208, stabilize the sets 202-204 during transportation, and/or provide an even surface for depositing elastomeric material on the sets 202-204.

Although FIG. 2B illustrates the sets 202-204 as being completely embedded in the filling material 210, at a minimum, the filling material 210 is used to fill in a gap separating the sets 202-204. In the example of FIG. 2B, the filling material 210 is in contact with a surface of the region 206 between the sets 202-204.

Referring to FIG. 2C, LLO is performed based on transmitting light 212 through the substrate 200 toward the sets 202-204. In some embodiments, the light 212 has a wavelength within the ultraviolet range of the electromagnetic spectrum. The light 212 may be laser light that is emitted in pulses at a predetermined repetition rate (e.g., 200 kHz). The light 212 is absorbed by the sets 202-204, which become heated to a high temperature (e.g., 850-1500 degrees Celsius). This causes surface decomposition (e.g., to a depth of 50-100 nanometers) of the sets 202-204 where they are attached to the substrate 200, thereby causing them to become detached from the substrate 200 as illustrated in FIG. 2D.

For example, the sets 202-204 may be attached to the substrate 200 by a layer of a semiconductor compound (e.g., GaN) that was epitaxially grown on the substrate 200. The light 212 may penetrate a surface of the compound, and the resulting heat may cause intramolecular bonds to break. Different elements of the compound may have different states, thereby facilitating removal of an element. To illustrate, nitrogen may be released as a gas, leaving behind a layer of solid gallium. The remaining element (e.g., the solid gallium) may be heated above its melting point, such as by placing a hot plate under the substrate 208, to enable separation of the substrate 200 from the sets 202-204. Any of the remaining element left on the sets 202-204 may be removed thereafter, such as by an etching process (e.g., wet-etching gallium with diluted hydrochloric acid).

However, the light 212 not only interacts with a surface of the sets 202-204, but also interacts with a surface of the filling material 210 that had been in contact with the substrate 200. As a result, the surface of the filling material 210 may heat up, melt, or vaporize, thereby inducing mechanical stress that can cause the sets 202-204 to fracture and become unusable.

Figure 3:
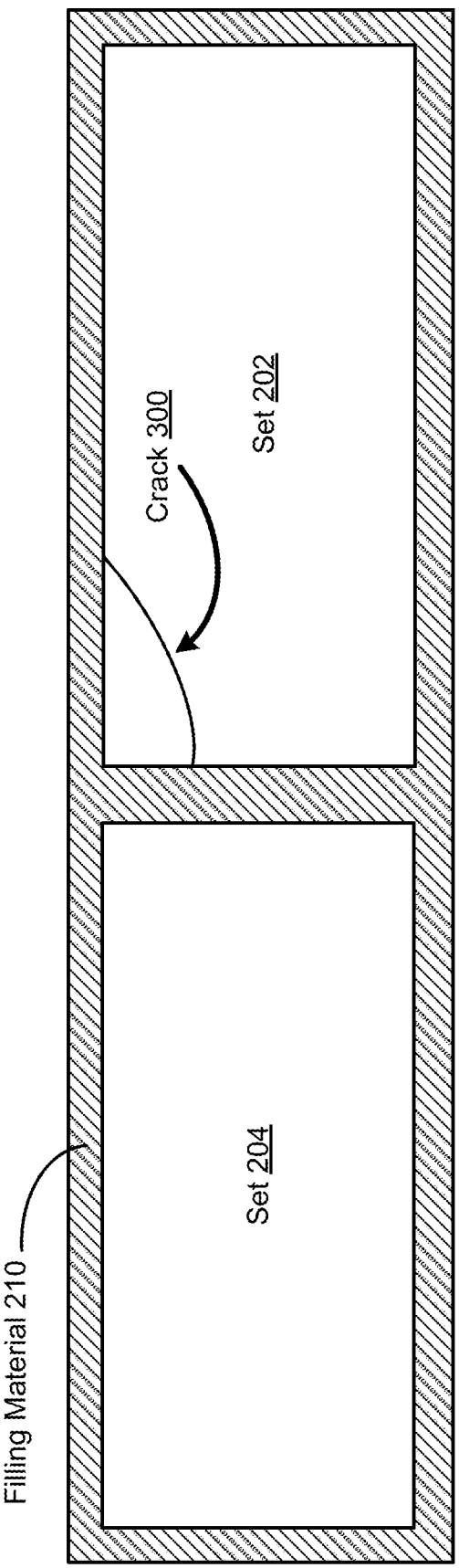
FIG. 3 illustrates an example result of performing LLO without LLO masks, in accordance with an embodiment.

FIG. 3 is a top view of the sets 202-204 upon removal of the substrate 200. A crack 300 is formed on the set 202 as a result of performing LLO. In some cases, performing LLO may cause a small crack to form, but the crack may subsequently increase in size when pressure is applied. For example, a crack may propagate across the length of a set when thermocompression is performed to bond the set to a display system.

As mentioned above, there are many theories as to what causes cracks to form when LLO is performed. Some theories posit that the cracks are caused by mechanical stress that is induced when the filling material 210 changes state. According to these theories, the filling material 210 heats up when it absorbs the laser light, thereby causing the filling material 210 to liquefy and/or vaporize.

Some theories posit that mechanical stress is induced by expansion of the filling material 210 and/or all or part of the sets 202-204 upon being heated. Thus, the expansion may cause the sets 202-204 to fracture as a result of confinement to an insufficient amount of space.

Some theories posit that mechanical stress is induced by surface contamination. According to these theories, laser light scans the substrate 200 in overlapping patterns. Thus, some regions of the substrate 200 are scanned multiple times. Furthermore, some of these regions comprise both a semiconductor material and the filling material 210. At such regions, a first scan may cause separation of the semiconductor material from the substrate 200, and a second scan may cause adjacent filling material to heat up and expand into an area where the substrate 200 and the semiconductor material had previously been attached. Thus, the interposed filling material may serve as a wedge that causes fracturing.

LLO Masks

To reduce the amount of interaction between the laser light and the filling material, masking material can be used to protect the filling material from the laser light. FIGS. 4A-B illustrate example LLO masks that enable prevention of semiconductor fracturing.

Referring to FIG. 4A, masking material 400-404 is applied to a surface (e.g., a top surface) of the substrate 200. In some embodiments, application of the masking material 400-404 is performed prior to positioning the sets 202-204 on the substrate 208. However, in other embodiments, application of the masking material 400-404 may be performed after positioning the sets 202-204 on the substrate 208. For example, the masking material 400-404 may be applied to an opposite surface (e.g., a bottom surface) of the substrate 200 of FIG. 4A such that the substrate 200 is situated between the filling material 210 and the masking material 400-404. What is important is that masking material covers gap regions of the substrate 200 without covering the sets 202-204.

The masking material 400-404 may be composed of any material having a sufficiently high melting point so as not to be vaporized by the laser light. In some embodiments, the masking material 400-404 is a metallic material, such as tungsten, that is relatively easy to apply and/or to remove. Application and removal of the masking material 400-404 are described in subsequent sections of this disclosure.

At a minimum, the masking material 400 is applied to one or more regions, such as the region 206, between the sets 202-204. However, in some embodiments, the masking material 402-404 is also applied to the surface of the substrate 200 outside of the one or more regions between the sets 202-204. In the example of FIG. 4A, the masking material 402-404 is applied to the surface of the substrate 200 at one or more border regions between a set and an outer edge of the substrate 200. Alternatively, the sets 202-204 may be placed on the substrate 200 such that there are no border regions.

Referring to FIG. 4B, the sets 202-204 are situated on the substrate 208 and embedded in the filling material 210. Thus, the masking material 400-404 becomes situated between the substrate 200 and the filling material 210. Accordingly, when laser light is transmitted through the substrate 200, the masking material 400-404 can protect some of the filling material 210 from interaction with the laser light.

LLO Mask Formation

LLO masks may be formed based on applying the masking material 400-404 to the substrate 200 using any of a variety of sputtering techniques. Example sputtering techniques include, without limitation, direct current (DC) sputtering or radio frequency (RF) sputtering. As mentioned above, the masking material 400-404 is a metallic material in some embodiments. However, application of the metallic material to a semiconductor device can cause short circuiting when the semiconductor device is operated. Thus, the masking material 400-404 should be selectively applied to the substrate 200 and not to the sets 202-204. As described in further detail below, this can be achieved using photoresist material.

FIGS. 5A-D illustrate an example process for selectively applying the masking material 400-404 using a positive photoresist material 500. The positive photoresist material 500 may be composed of a photosensitive polymer which, when exposed to light within a particular wavelength range, becomes soluble to a photoresist developer.

Referring to FIG. 5A, the sets 202-204 are embedded in the positive photoresist material 500. Significantly, a side (e.g., a top side) of the sets 202-204 having the electrical contacts 108-110 is covered.

Referring to FIG. 5B, light 502 is transmitted through the substrate 200 toward the sets 202-204. The light 502 has a wavelength within a particular range of the electromagnetic spectrum that causes exposed regions of the positive photoresist material 500 to become soluble to a photoresist developer. For example, the light 502 may be an ultraviolet light having a wavelength of less than 360 nanometers so that microLEDs comprising GaN, which strongly absorbs wavelengths below 360 nanometers, can serve as efficient masks against the light.

Significantly, exposure to the light 502 enables removal of the positive photoresist material 500 from one or more exposed regions of the substrate 200. These are the one or more regions that are not attached to the sets 202-204. However, regions 504-506 that remain unexposed to the light 502 continue to cover the side of the sets 202-204 on which the electrical contacts 108-110 are located.

Figure 5C:
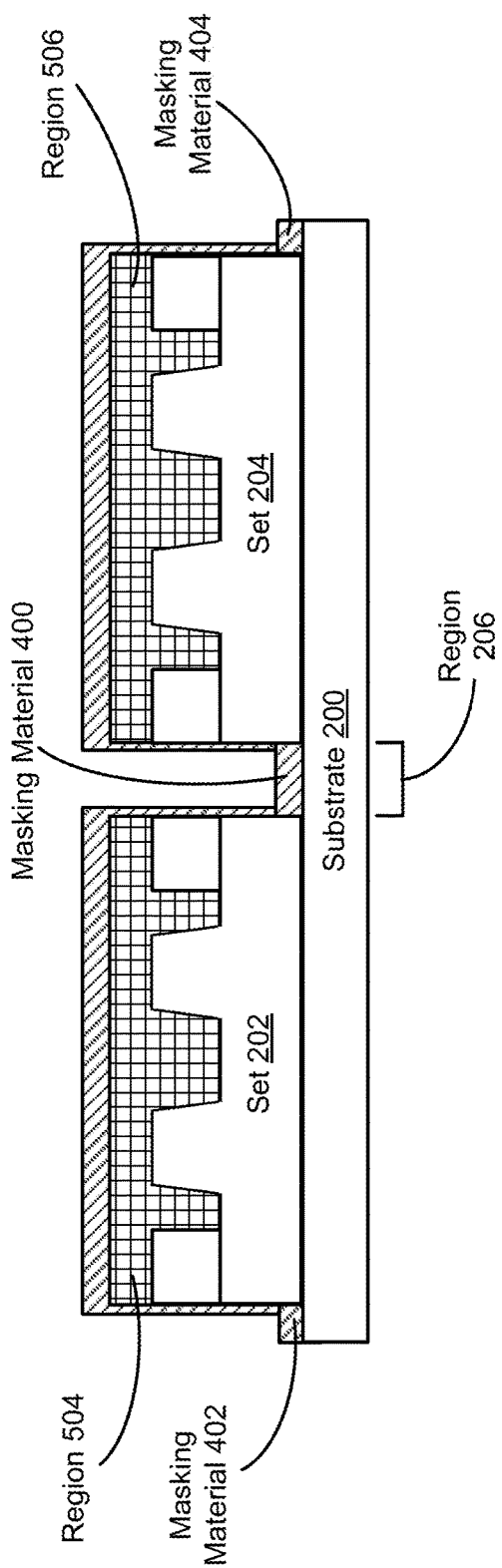

Referring to FIG. 5C, the masking material 400-404 is applied to the substrate 200. As mentioned above, this can be achieved based on a sputtering process. For example, DC sputtering may be used to deposit a tungsten layer having a thickness of 150 nanometers. Significantly, the masking material 400-404 is applied to the one or more regions of the substrate 200 from which the positive photoresist material 500 was removed.

Figure 5D:
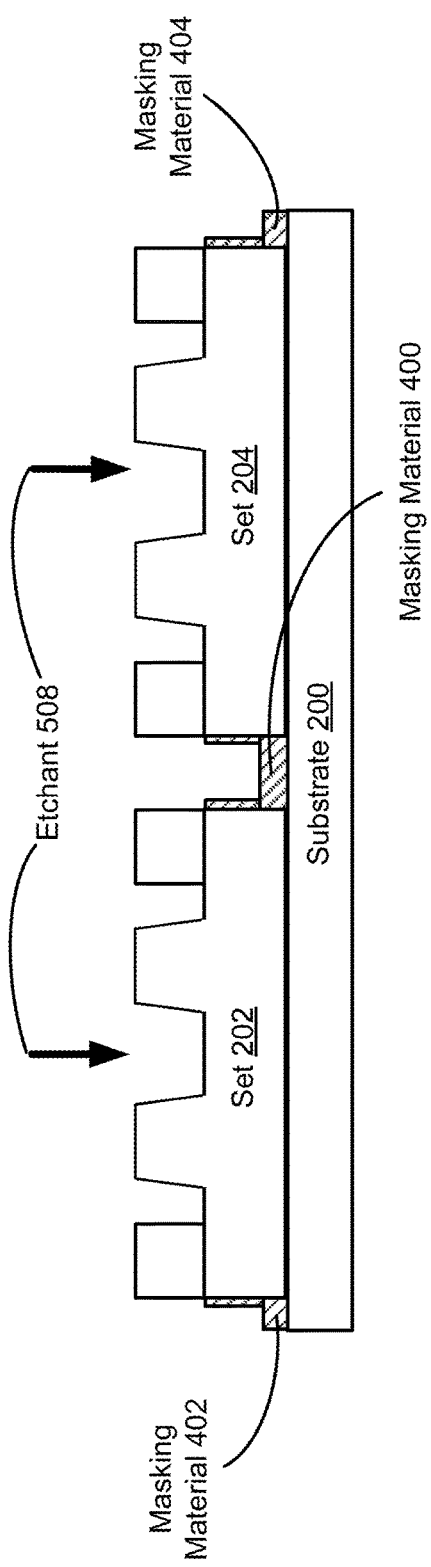

Referring to FIG. 5D, the remaining regions 504-506 of the positive photoresist material 500 are removed as part of a photolithographic lift-off process. Any of a variety of photoresist removal techniques may be used. For example, the regions 504-506 may be exposed to the light 502 and washed away using a photoresist developer. Other examples include, without limitation, any of a variety of wet-etching processes.

In the example of FIG. 5D, an etchant 508 is used to remove the regions 504-506 along with any masking material attached thereto. Examples of the etchant 508 include, without limitation, acetone or any other positive photoresist remover. In some embodiments, masking material attached to the walls of the sets 202-204 is removed based on using another etchant. For example, tungsten can be removed by wet-etching with hydrogen peroxide. This can be performed after depositing a sufficient amount of the filling material 210 to cover the masking material 400-404 without completely covering the masking material attached to the walls. Partial dry etching of the filling material 210 may be performed to arrive at the sufficient amount. Thereafter, FIG. 5D may proceed according to a process similar to that illustrated in FIGS. 4A-B.

FIGS. 6A-F illustrate an example process for selectively applying the masking material 400-404 using a negative photoresist material 600. The negative photoresist material 600 may be composed of a photosensitive polymer which, when exposed to light within a particular wavelength range, becomes insoluble to a photoresist developer.

Referring to FIG. 6A, the sets 202-204 are embedded in the negative photoresist material 600. Significantly, a side (e.g., a top side) of the sets 202-204 having the electrical contacts 108-110 is covered.

Referring to FIG. 6B, light 602 is transmitted through the substrate 200 toward the sets 202-204. The light 602 has a wavelength within a particular range of the electromagnetic spectrum that causes exposed regions of the negative photoresist material 600 to become insoluble to a photoresist developer. For example, the light 602 may be an ultraviolet light having a wavelength of less than 360 nanometers.

Significantly, exposure to the light 602 enables removal of the negative photoresist material 600 from unexposed regions that covered the side of the sets 202-204 on which the electrical contacts 108-110 are located. However, regions 604-608 that are exposed to the light 602 continue to cover one or more regions of the substrate 200.

Referring to FIG. 6C, the negative photoresist material 600 that was removed from regions 610-612 is, in effect, replaced with a different material. The different material may be composed of any material that is not removed when the negative photoresist material 600 is removed. For example, the different material may be a positive photoresist material that is poured into the regions 610-612 and cured.

Referring to FIG. 6D, the remaining regions 604-608 of the negative photoresist material 600 are removed. Any of a variety of photoresist removal techniques may be used. For example, the negative photoresist material 600 may be a reversible photoresist material such that the regions 604-608 may be exposed to a light and washed away using a photoresist developer. Other examples include, without limitation, an etching process involving acetone, oxygen plasma, or some other etchant.

Figure 6E:
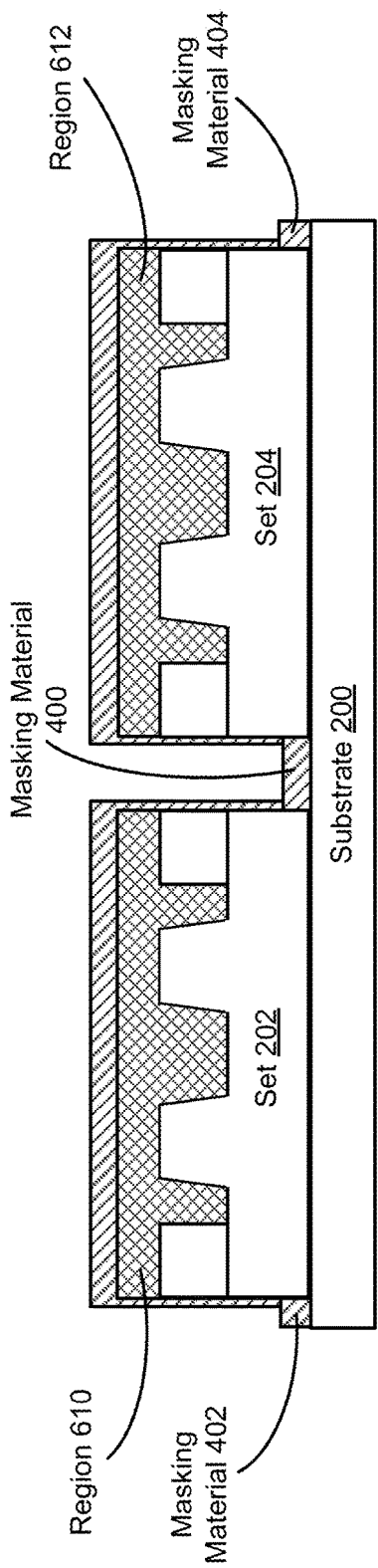

Referring to FIG. 6E, the masking material 400-404 is applied to the substrate 200. As mentioned above, this can be achieved based on a sputtering process. Significantly, the masking material 400-404 is applied to the one or more regions of the substrate 200 from which the negative photoresist material 600 was removed.

Figure 6F:
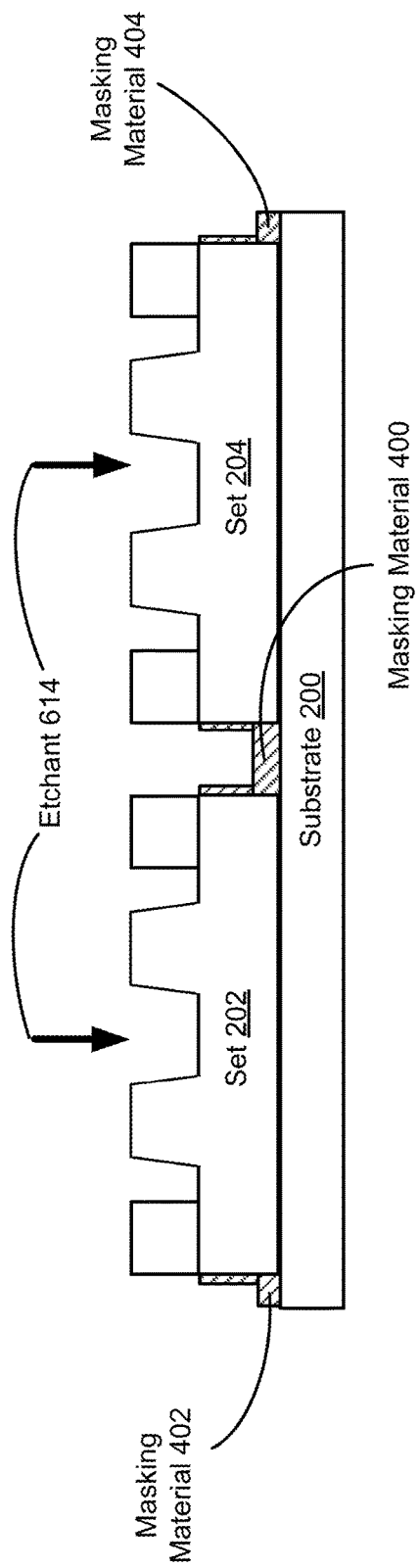

Referring to FIG. 6F, the regions 610-612 of the different material are removed. Any of a variety of removal techniques may be used. In the example of FIG. 6F, an etchant 614 is used to remove the regions 610-612 along with any masking material attached thereto. The etchant 614 may be, for example, acetone or any other positive photoresist remover.

In some embodiments, masking material attached to the walls of the sets 202-204 is removed based on using another etchant. For example, tungsten can be removed by wet-etching with hydrogen peroxide. This can be performed after depositing a sufficient amount of the filling material 210 to cover the masking material 400-404 without completely covering the masking material attached to the walls. Partial dry etching of the filling material 210 may be performed to arrive at the sufficient amount. Thereafter, FIG. 6F may proceed according to a process similar to that illustrated in FIGS. 4A-B.

LLO Mask Removal

After LLO is performed, the masking material 400-404 and/or the filling material 210 may be removed. For example, the masking material 400-404 and/or the filling material 210 may be removed in preparation for a pick-and-place process. Removal of any of the masking material 400-404 may be performed if any of the masking material 400-404 becomes detached from the substrate 200. However, if all of the masking material 400-404 remains attached to the substrate 200, one or more steps of the processes described below may be skipped.

FIGS. 7A-B illustrate an example process for removing LLO masks without "wings". As used herein, the term "wings" refers to a thin layer of excess masking material that is attached to walls of the sets 202-204. As mentioned above with reference to FIGS. 5D and 6F, LLO mask wings can be removed, for example, by wet-etching using hydrogen peroxide. LLO mask wings are described further with reference to FIGS. 8A-D.

Referring to FIG. 7A, an etchant 700 is used to remove the "wingless" masking material 400-404. For example, if the masking material 400-404 is composed of tungsten, then the etchant 700 may be hydrogen peroxide.

Referring to FIG. 7B, an etchant 702 is used to remove the filling material 210. For example, the etchant 702 may a plasma that is used with a dry etching technique. Examples of dry etching techniques include, without limitation, Radio Frequency (RF) oxygen plasma etching, reactive ion etching (ME), and/or inductively coupled plasma (ICP) etching.

FIGS. 8A-D illustrate an example process for removing "winged" LLO masks. In the examples of FIGS. 8A-D, the wings comprise auxiliary masking material that is perpendicular to the masking material 400-404. As described in greater detail below, removal of winged LLO masks can be performed in iterative phases.

Referring to FIG. 8A, an etchant 800 is used to remove the "wingless" masking material 400-404. As mentioned above, if the masking material 400-404 is composed of tungsten, then the etchant 800 may be hydrogen peroxide.

Referring to FIG. 8B, an etchant 802 is used to remove some of the filling material 210. More specifically, a predetermined depth (e.g., a few microns) of the filling material 210 is removed. The predetermined depth may correspond to the height of the LLO mask wings. As mentioned above, the etchant 702 may a plasma that is used with a dry etching technique.

Referring to FIG. 8C, the etchant 800 is again used to remove masking material. However, the masking material that is removed this time corresponds to the LLO mask wings.

Referring to FIG. 8D, the etchant 802 is again used to remove remaining portions of the filling material 210. The sets 202-204 may then be flip-chip mounted onto a display substrate.

Process Overview

Figure 9:
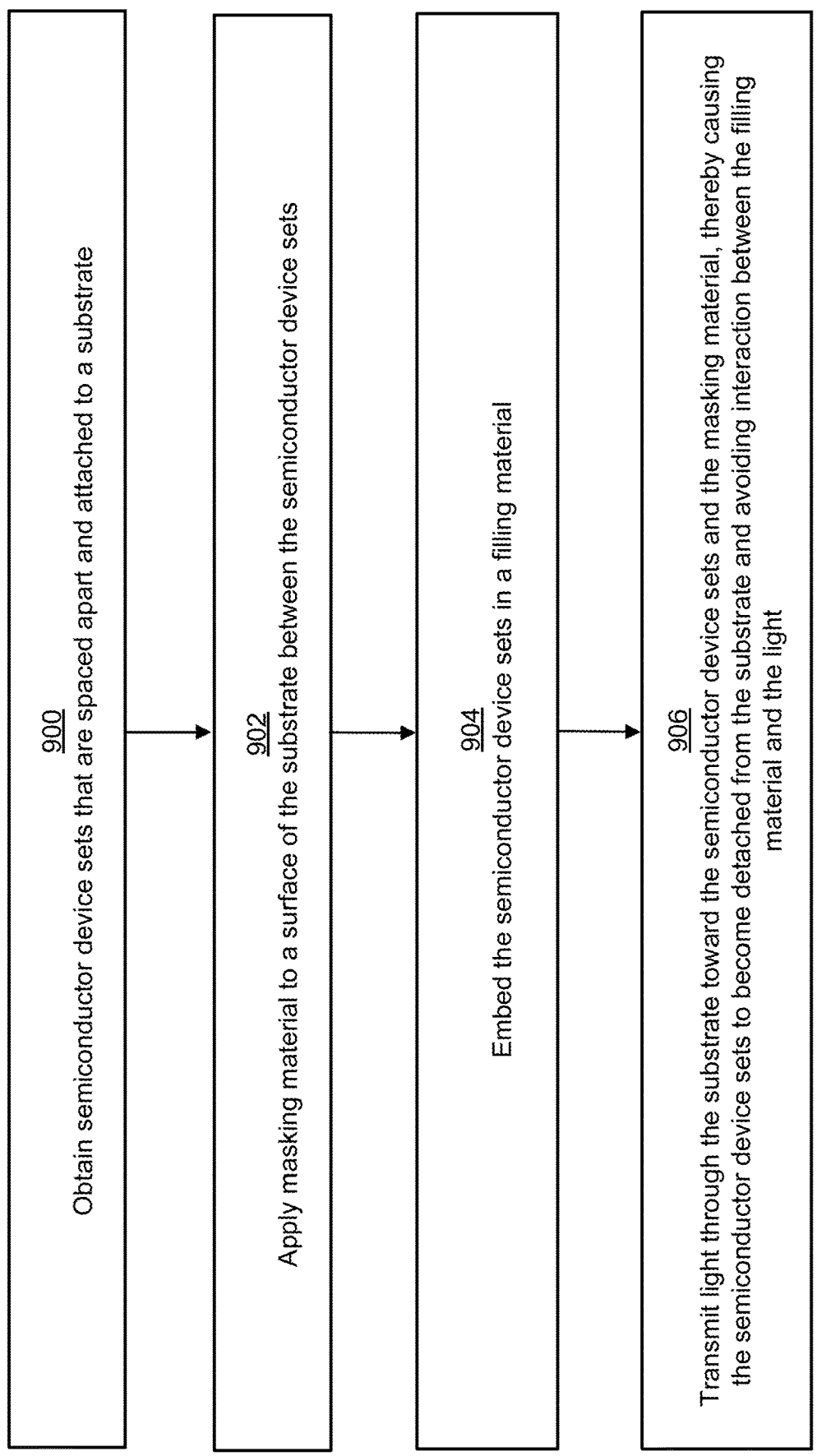
FIG. 9 is a flow diagram illustrating an example approach for performing LLO using one or more LLO masks, in accordance with an embodiment.

FIG. 9 illustrates an example process for performing LLO using one or more LLO masks. In some embodiments, the example process is performed at a station of a fabrication system that incorporates LEDs into display systems.

At block 900, the station obtains semiconductor device sets that are spaced apart from each other. Each set may comprise one or more semiconductor devices. The sets are attached to a substrate, such as the one on which they were epitaxially grown.

At block 902, the station applies masking material to a surface of the substrate. In some embodiments, the surface corresponds to one or more regions of the substrate that separate the sets. As described in greater detail below, application of the masking material can prevent the substrate from coming into contact with a filling material.

At block 904, the station embeds the sets in a filling material. In some embodiments, the masking material is situated between the filling material and the substrate, thereby enabling the masking material to occlude light from reaching the filling material.

At block 906, the station transmits light through the substrate toward the sets and the masking material. This causes the sets to become detached from the substrate while avoiding interaction between the filling material and the light that would otherwise result in crack formation.

System Overview

Figure 10:
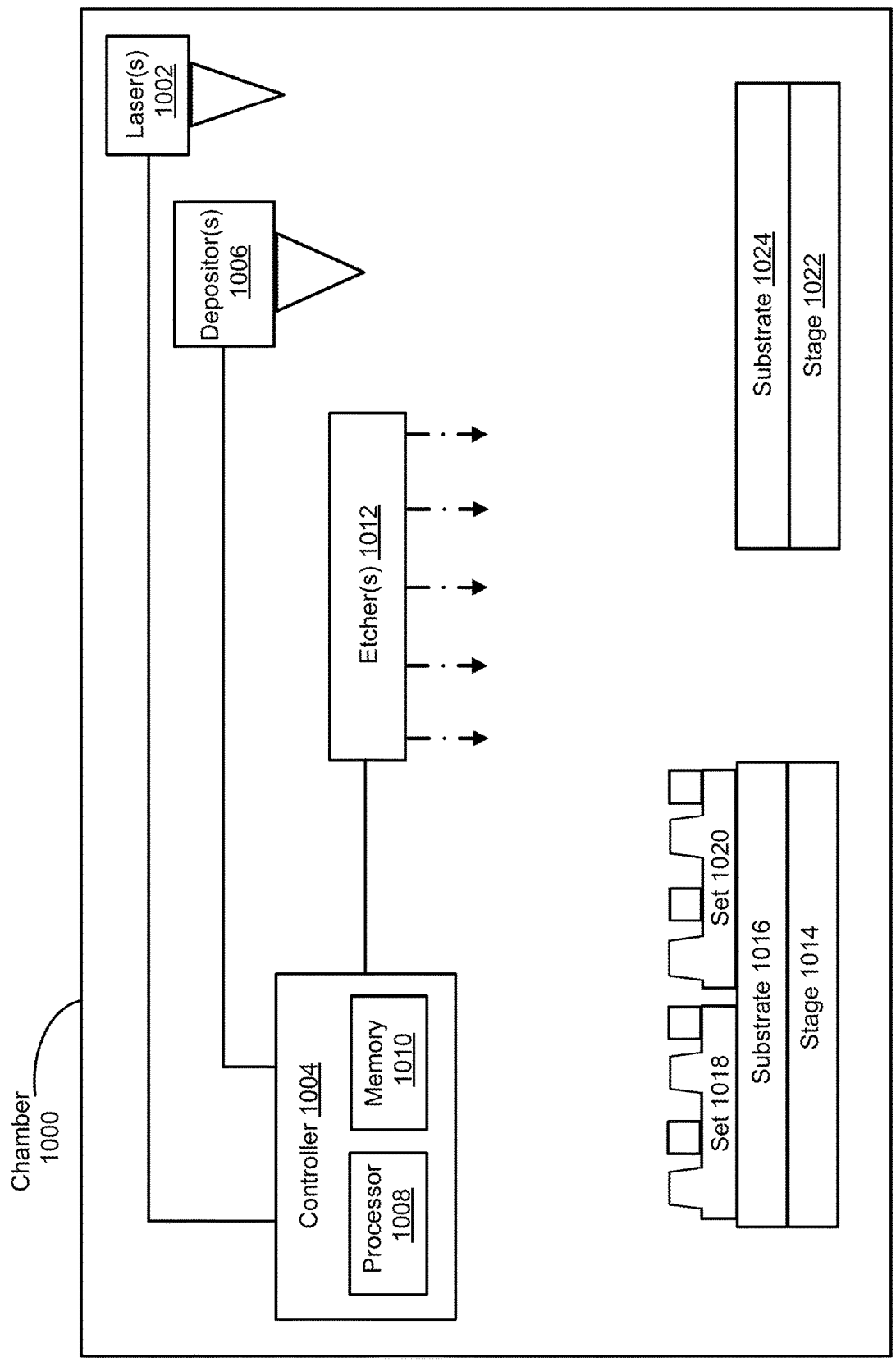
FIG. 10 illustrates an example fabrication system, in accordance with an embodiment.

FIG. 10 illustrates an example fabrication system. In some embodiments, the fabrication system comprises a station that incorporates LED devices into a display system. The fabrication system includes a chamber 1000 that defines an interior environment for incorporating LED devices into a display system. The chamber 1000 houses various system components including laser(s) 1002; a controller 1004; depositor(s) 1006; etcher(s) 1012; substrates 1016 and 1024; and stages 1014 and 1022. The chamber 1000 may also house other system components not illustrated in FIG. 8. For example, the chamber 1000 may also house a scanning electron microscope in a high pressure atmosphere of water vapor.

The substrate 1016 may be a growth substrate upon which sets 1018-1020 are grown. The sets 1018-10120 may be the same or similar to the sets 202-204 described above. The substrate 1016 is attached to a semiconductor layer of the sets 1018-1020. LLO is performed to separate the substrate 1016 from the sets 1018-1020. Thus, the substrate 1016 is composed of a transparent/quasi-transparent material through which the laser(s) 1002 can transmit light.

The stage 1014 holds the substrate 1016. The stage 1014 may be movable in a variety of directions including, without limitation, up and down; left and right; and forward and back.

The substrate 1024 serves as a carrier for the sets 1018-1020. LLO is performed when the substrate 1016 and the sets 1018-1020 are flipped over and positioned on the substrate 1024. In some embodiments, the substrate 1024 is also composed of a transparent/quasi-transparent material, such as glass or silicon.

The stage 1022 holds the substrate 1024. The stage 1022 may be movable in a variety of directions including, without limitation, up and down; left and right; and forward and back.

The laser(s) 1002 transmit light for performing LLO and/or for changing the state (e.g., soluble or insoluble) of photoresist material. The laser(s) 1002 may be positioned such that light is transmitted in a first direction (e.g., downward through the substrate 1016) or in a second direction (e.g., upward through the substrate 1024) that is opposite of the first direction.

The depositor(s) 1006 apply materials to the substrate 1016 and the sets 1018-1020. The materials may include masking material, filling material, photoresist material, and/or any of a variety of etchants.

The etcher(s) 1012 can be used to perform dry etching based on instructions received from the controller 1004. More specifically, the etcher(s) 1012 bombard filling material with plasma, thereby eroding the filling material. The etcher(s) 1012 may include gas intake and gas out-take valves, ionizing plates, and any other standard etching components.

The controller 1004 is coupled to the laser(s) 1002; the depositor(s) 1006; and the etcher(s) 1012 and, thus, controls their operation. The controller 1004 may include, among other components, a memory 1010 and processor(s) 1008. The memory 1010 stores instructions for operating the laser(s) 1002, the depositor(s) 1006, and the etcher(s) 1012. The memory 1010 may be implemented using any of a variety of volatile or non-volatile computer-readable storage media including, without limitation, SRAM, DRAM, and/or ROM. The processor(s) 1008 execute the instructions stored in the memory 1010 and send instructions toward the laser(s) 1002, the depositor(s) 1006, and the etcher(s) 1012. In some embodiments, the processor(s) 1008 execute the example process illustrated in FIG. 9.

Embodiments of the invention may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

The foregoing description of the embodiments of the disclosure has been presented for the purpose of illustration; it is not intended to be exhaustive or to limit the disclosure to the precise forms disclosed. Persons skilled in the relevant art can appreciate that many modifications and variations are possible in light of the above disclosure.

Some portions of this description describe the embodiments of the disclosure in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, and/or hardware.

Steps, operations, or processes described may be performed or implemented with one or more hardware or software modules, alone or in combination with other devices. In some embodiments, a software module is implemented with a computer program product comprising a computer-readable medium containing computer program code, which can be executed by a computer processor for performing any or all of the steps, operations, or processes described.

Embodiments of the disclosure may also relate to an apparatus for performing the operations described. The apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Embodiments of the disclosure may also relate to a product that is produced by a computing process described herein. Such a product may comprise information resulting from a computing process, where the information is stored on a non-transitory, tangible computer readable storage medium and may include any embodiment of a computer program product or other data combination described herein.

The language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the disclosure, which is set forth in the following claims.

What is claimed is:

1. A method comprising:
   obtaining a plurality of semiconductor devices formed on a common substrate, the plurality of semiconductor devices including a first semiconductor device and a second semiconductor device spaced apart by a gap region of the substrate;
   applying masking material over the gap region of the substrate;
   embedding the plurality of semiconductor devices in a filling material; and
   transmitting a first light through the substrate toward the plurality of semiconductor devices and the masking material, thereby causing the substrate to become detached from the plurality of semiconductor devices, wherein the first light is at least partially occluded by the masking material from reaching the filling material between the first semiconductor device and the second semiconductor device.

2. The method of claim 1, wherein the masking material occludes the first light such that there is substantially no interaction between the first light and the filling material.

3. The method of claim 1, wherein the masking material occludes the first light such that a reduced amount of heat results from interaction between the first light and the filling material.

4. The method of claim 1, wherein embedding the plurality of semiconductor devices causes the masking material to be situated between the filling material and the substrate.

5. The method of claim 1, further comprising:
   prior to applying the masking material, embedding the plurality of semiconductor devices in a positive photoresist material;
   transmitting a second light through the gap region of the substrate toward the positive photoresist material, thereby exposing one or more regions of the positive photoresist material to the second light; and
   removing the one or more regions of the positive photoresist material.

6. The method of claim 5, further comprising:
   after applying the masking material, removing regions of the positive photoresist material that remain unexposed to the second light.

7. The method of claim 1, further comprising:
   prior to applying the masking material, embedding the plurality of semiconductor devices in a negative photoresist material;
   transmitting a second light through the gap region of the substrate toward the negative photoresist material, thereby exposing one or more regions of the negative photoresist material to the second light; and
   replacing, with a different material, regions of the negative photoresist material that remain unexposed to the second light; and
   removing the one or more regions of the negative photoresist material.

8. The method of claim 7, further comprising:
   after applying the masking material, removing the different material.

9. The method of claim 1, wherein the masking material is a metallic material that is applied based on a sputtering process.

10. A semiconductor device fabricated by a method comprising:
    obtaining a plurality of semiconductor devices formed on a common substrate, the plurality of semiconductor devices including a first semiconductor device and a second semiconductor device spaced apart by a gap region of the substrate;
    applying masking material over the gap region of the substrate;
    embedding the plurality of semiconductor devices in a filling material; and
    transmitting a first light through the substrate toward the plurality of semiconductor devices and the masking material, thereby causing the substrate to become detached from the plurality of semiconductor devices, wherein the first light is at least partially occluded by the masking material from reaching the filling material between the first semiconductor device and the second semiconductor device.

11. The semiconductor device of claim 10, wherein the masking material occludes the first light such that there is substantially no interaction between the first light and the filling material.

12. The semiconductor device of claim 10, wherein the masking material occludes the first light such that a reduced amount of heat results from interaction between the first light and the filling material.

13. The semiconductor device of claim 10, wherein embedding the plurality of semiconductor devices causes the masking material to be situated between the filling material and the substrate.

14. The semiconductor device of claim 10 fabricated by the method, the method further comprising:
   prior to applying the masking material, embedding the plurality of semiconductor devices in a positive photoresist material;
   transmitting a second light through the gap region of the substrate toward the positive photoresist material, thereby exposing one or more regions of the positive photoresist material to the second light; and
   removing the one or more regions of the positive photoresist material.

15. The semiconductor device of claim 14 fabricated by the method, the method further comprising:
   after applying the masking material, removing regions of the positive photoresist material that remain unexposed to the second light.

16. The semiconductor device of claim 10 fabricated by the method, the method further comprising:
   prior to applying the masking material, embedding the plurality of semiconductor devices in a negative photoresist material;
   transmitting a second light through the gap region of the substrate toward the negative photoresist material, thereby exposing one or more regions of the negative photoresist material to the second light; and
   replacing, with a different material, regions of the negative photoresist material that remain unexposed to the second light; and
   removing the one or more regions of the negative photoresist material.

17. The semiconductor device of claim 16 fabricated by the method, the method further comprising:
   after applying the masking material, removing the different material.

18. A non-transitory computer-readable storage medium storing processor-executable instructions for:
   obtaining a plurality of semiconductor devices formed on a common substrate, the plurality of semiconductor devices including a first semiconductor device and a second semiconductor device spaced apart by a gap region of the substrate;
   applying masking material over the gap region of the substrate;
   embedding the plurality of semiconductor devices in a filling material; and
   transmitting a first light through the substrate toward the plurality of semiconductor devices and the masking material, thereby causing the substrate to become detached from the plurality of semiconductor devices, wherein the first light is at least partially occluded by the masking material from reaching the filling material between the first semiconductor device and the second semiconductor device.

19. The non-transitory computer-readable storage medium of claim 18, wherein the masking material occludes the first light such that there is substantially no interaction between the first light and the filling material.

20. The non-transitory computer-readable storage medium of claim 18, wherein the masking material occludes the first light such that a reduced amount of heat results from interaction between the first light and the filling material.

\* \* \* \* \*